(12) United States Patent
Gegenwart et al.

(10) Patent No.: US 6,444,043 B1
(45) Date of Patent: Sep. 3, 2002

(54) APPARATUS FOR DEPOSITING CDS AND CDTE LAYERS ON SUBSTRATES BY MEANS OF A CSS PROCESS

(75) Inventors: Rainer Gegenwart, Rödermark; Hilmar Richter, Niddatal-Assenheim, both of (DE)

(73) Assignee: Antec Solar GmbH, Arnstadt (DE)

( * ) Notice: Subject to any disclaimer, the term of this patent is extended or adjusted under 35 U.S.C. 154(b) by 0 days.

(21) Appl. No.: 09/522,104

(22) Filed: Mar. 9, 2000

(30) Foreign Application Priority Data

Mar. 29, 1999 (EP) .............................. 99106375

(51) Int. Cl.⁷ .............................. C23C 14/00
(52) U.S. Cl. ...................... 118/726; 392/389
(58) Field of Search ............... 118/726; 392/389

(56) References Cited

U.S. PATENT DOCUMENTS

| | | | | |
|---|---|---|---|---|
| 2,426,377 A | * | 8/1947 | Smith | 118/726 |
| 4,401,052 A | * | 8/1983 | Baron | 118/726 |
| 4,543,467 A | * | 9/1985 | Eisele | 118/726 |
| 5,304,499 A | | 4/1994 | Bonnet et al. | 437/5 |
| 5,532,102 A | | 7/1996 | Soden et al. | 430/128 |
| 5,945,163 A | * | 8/1999 | Powell | 118/726 |

FOREIGN PATENT DOCUMENTS

| | | | |
|---|---|---|---|
| DE | 2436431 A | 2/1976 | C23C/13/12 |
| DE | 2653909 A | 6/1978 | C23C/13/12 |
| WO | WO9104348 A | 4/1991 | F27B/14/12 |

OTHER PUBLICATIONS

Chu, T. L, "Thin Film Cadmium Telluride Solar Cells By Two Chemical Vapor Deposition Techniques" *Solar Cells*, vol. 23, pp 31–48, (1988).

* cited by examiner

Primary Examiner—Richard Bueker
(74) Attorney, Agent, or Firm—Quarles & Brady LLP

(57) ABSTRACT

Apparatus for depositing substrates by means of a CSS process comprising a heated receptacle (20) for a supply (70) of material to be deposited and carrier means for holding the substrate (60) with its side to be deposited towards an opening (22) of said receptacle, said receptacle opening (22) being provided with a cover (30) including a plurality of through-holes (32) for the sublimated material, said cover separating said material supply (70) from said substrate (60) and, due to being heated to a temperature higher than that of said receptacle (20), acting as sublimation source for said substrate.

16 Claims, 3 Drawing Sheets

APPARATUS FOR DEPOSITING CDS AND CDTE LAYERS ON SUBSTRATES BY MEANS OF A CSS PROCESS

CROSS REFERENCES TO RELATED APPLICATIONS

Not Applicable

STATEMENT REGARDING FEDERALLY SPONSORED RESEARCH

Not Applicable

BACKGROUND OF THE INVENTION

The present invention relates to an apparatus for depositing CdS and CdTe layers on substrates by means of a PVD process (Physical Vapor Deposition Process) in the form of a CSS (Close Spaced Sublimation) process. In particular, the invention is directed to a process for deposition of sublimated materials onto substrates for the production of CdS/CdTe solar cells.

In industrial semiconductor deposition processes and in those processes for manufacturing large-area electronic components CVD processes (Chemical Vapor deposition Processes) are employed for depositing, particularly silicon or dielectrics, such as $SiO_2$, $Si_3N_4$. Corresponding devices for mass production have been known. For the production of electronic and optical components, furthermore, selenium layers have been applied by CVD processes since a long time, as will be described in more detail in the following.

For the production of e.g. electroluminescence displays or certain solar or photovoltaic cells, such as CdS/CdTe solar cells, on the other hand, PVD processes are suited which provide thin layers or films by vapor deposition of material from a heated source. In addition to thermal evaporizers utilized, for instance, in the field of large area electronics (e.g. for the production of displays), particularly the CSS technology has been used during the last decades for CdS/CdTe solar cells. The devices hitherto known have not been suited for a continuous production of larger modules, neither with a view to their dimensions nor to their material sources.

The CSS technology as compared to CVE technology (Combination of Vapors of Elements) offers the advantage that, for instance, CdTe can be deposited with very high deposition rate. The microstructure, on the other hand, and the resulting electric properties of the CdTe layer-generated are suited for solar cell technology only if and when the close space or CSS distance between the sublimation material and the substrate is accurately adjusted and maintained and all the components of the source material, in the present case of the dissociated CdTe, are directly transported to the substrate surface for recombination thereon, independently from the remaining system parameters and the conditions elsewhere in the system. The close space distance is generally smaller than a few percent of the substrate dimensions. In order to ensure, moreover, that the condensation process remains limited to the small distance area between substrate and source material and that the desired temperature-depending dissociation pressure is obtained, pressure and temperature of source material and substrate should sensitively be adapted to each other.

When adapting a CSS apparatus to production scales including large deposition surfaces and high throughput, it should be ensured that the apparatus can be integrated in a continuous production line. The possibility of using a large number of adjacent evaporator sources was turned down because of the immense constructional efforts and the necessity of adjusting similar conditions of deposition at all sources. It was furthermore turned down to employ large-volume receptacles and to vary the temperatures thereof during the course of the deposition in order to adapt for deposition rate changes depending on the filling level of the material source or supply. Such temperature changes are hardly manageable the more so as layer formation on the substrate is considerably affected thereby.

BRIEF SUMMARY OF THE INVENTION

In view of long years of experience in connection with the critical deposition parameters for CdS/CdTe solar cells in CSS processes, the present inventors were indeed surprised that notwithstanding the problematic nature as outlined above it was possible to substantially uncouple the source material from the substrate in a spatial and physical manner and to locally displace the CSS distance between source material and substrate out of a source material receptacle in the area between the substrate and the cover provided at the opening of the receptacle of the inventional apparatus. Accordingly, the source material and substrate are actually separated by a multiple of the CSS distance from each other. Thereby, it became possible to operate with practically any receptacle and material supply.

An object of the present invention is to provide an apparatus for depositing CdS and CdTe layers on substrates by means of a PVD process in form of a CSS process, which is suited for a large-size deposition and a continuous deposition process. The object is solved by the subject matter of claim 1. Advantageous further developments are defined in the subclaims.

Based on the solution revealed in claim 1, it is possible to employ a large-surface sublimation source which allows sufficient material supply for a long uninterrupted production period without having to resort to corrective measures which depend on the actual filling level or having to refill the material supply. The cover provided according to the invention uncouples the deposition process from the material supply. Because of the higher temperature of the cover, the substrate does no longer "see" the material supply, as was the case in CSS apparatuses hitherto used, but, instead, the substrate rather "sees" the cover as sublimation source which thereby acts as physical deposition source and determines the thermal and kinetic behavior of the evaporated or sublimated materials, respectively. Consequently, the cover provides for spatial and physical separation of the material supply from the substrate. Contrary to disturbances and problems otherwise observed even in case of smallest interferences into the parameters of the deposition process, the deposition behavior, nevertheless, does not change. The inventors using the now completely differently dimensioned CSS deposition apparatus were able to successfully produce CdS/CdTe solar cells of high efficiency and output by applying temperature and pressure parameters which had proved of advantage in a typical conventional CSS device. According to the invention, changes of distribution and rate of deposition, otherwise occurring with decreasing filling level in the material receptacle, can successfully be avoided.

As described further above, substrates have been provided with selenium layers for a number of years using selenium which was evaporated in a material receptacle and impinged from the evaporation receptacle upon the material to be provided with the layer. Since as a rule evaporation and vapor exhaust from the receptacles are non-uniform, it has become, and still is, the practice to close the receptacles by a sieve or a perforated plate with through-holes (See, U.S. Pat. No. 5,532,102; DE 24 36 431 A; and WO 91 04 348 A). These holes plates provided a uniform deposition and vapor transport. Clogging of the holes is avoided in that the hole plate is heated in order to evaporize any condensing material. DE 24 36 431 A utilizes a hole plate the temperature of which is about 5 to 30° C. higher than the temperature of the material receptacle. A further advantage of the hole plate is that it blocks material spatters. According to U.S. Pat. No. 5,532,102, the hole plate is brought at the beginning of the deposition to a temperature significantly higher than the material receptacle and subsequently is lowered to that of the receptacle or somewhat higher. The holes in the cover are larger at the marginal zones of the plate in order to obtain a more uniform deposition of the vapor passing through the holes. WO 91 04 348 A employs heating means which are distributed over the complete height of an evaporation crucible in order to ensure highly uniform heat distribution. Uniform heat distribution is further promoted by a perforated cover arranged on the crucible, which is heated to a higher temperature relative to the crucible and should also block material spatters and the like. DE 26 53 909 A describes a thermal evaporization for large-surface substrates, which includes a perpendicularly disposed perforated cover. The surface area of the outlet openings of this vertical evaporization source should be less than 30%, preferably 15%, of the total cover surface. Condensations on the cover are avoided in that the cover material automatically heats up during the course of the deposition operation. In this way, reproducible vapor streams e.g. of evaporated silver, may be obtained.

The present invention, however, was not concerned with the problem to direct and distribute the evaporation cloud of a thermal evaporation source into a uniform and reproducible vapor stream onto a substrate using a perforated plate. The present invention, instead, had to solve the problem to precipitate elements having been dissociated by sublimation on a substrate such that the dissociated elements directly recombine on the substrate with a given micro structure of the resulting layer.

Preferred further developments of the present invention are defined in the subclaims. In this connection it is for instance possible to improve the deposition at the substrate edge zone by means of a particular hole pattern. A considerable improvement is, furthermore, accomplished by using a frame heated to a higher temperature than the temperature of the receptacle. Condensations of the sublimated material at the colder, outer upper edge of the material receptacle are thereby avoided, which otherwise would lead, in addition to material loss, also to transport problems. The material loss at the small gap between frame and substrate is, moreover, substantially reduced because this gap can be considerably smaller adjusted than the CSS distance between substrate and perforated cover. Hence, by means of that frame, considerably longer production periods can be obtained since precipitates at the upper edges of the receptacle which cannot be completely avoided anyway, grow more slowly because of the frame and need be removed less frequently. The frame may be a separate part arranged on the receptacle. It may also be integrated in a receptacle rim extending beyond the cover.

BRIEF DESCRIPTION OF THE DRAWINGS

In the following, a preferred embodiment of the present invention is explained in more detail referring to the drawings wherein.

DETAILED DESCRIPTION OF THE PREFERRED EMBODIMENTS

The apparatus of the invention is used as a CSS apparatus particularly for the production of CdS/CdTe solar cells. The apparatus can, in principle, also be provided with different sublimation sources for alternative applications. It is also suited for the production of other photovoltaic elements such as CIS modules (Cu In $Se_2$ modules) for instance with a CdS deposition to be applied.

Figure 1:
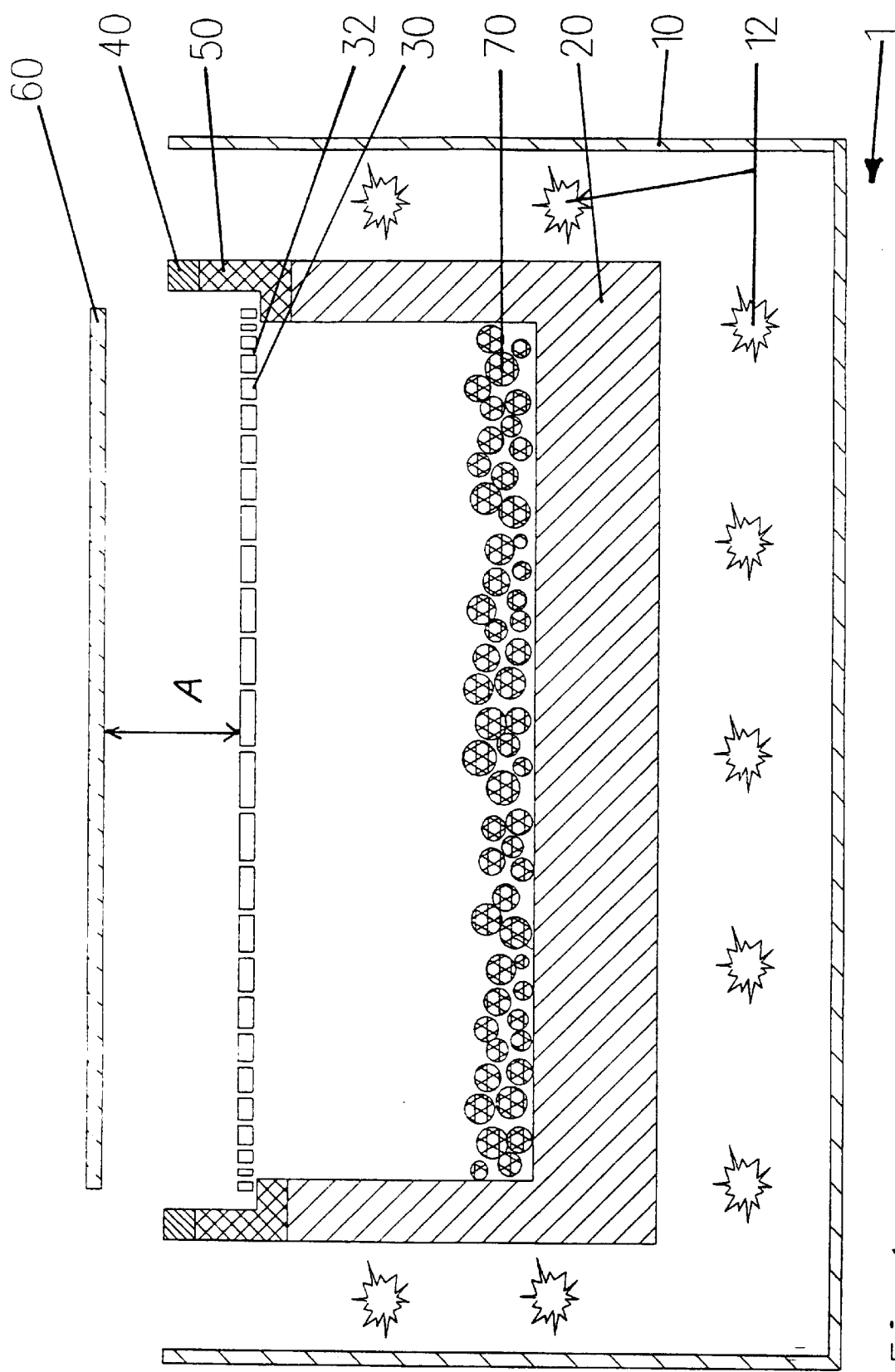
FIG. 1 is a diagrammatic sectional view of a preferred embodiment of the apparatus of the invention for horizontal deposition.

Apparatus 1 shown in FIG. 1 differs from prior art CSS deposition devices basically in that the close space distance for the deposition process is no longer defined between the material (CdS or CdTe, respectively) to be sublimated in the form of a granulate, of a polycrystalline disc or the like and the substrate (as shown for example EP 92 116 254.1 corresponding to EP 0,535,522 A2 and U.S. Pat. No. 5,304, 499). In a vacuum chamber, not shown, a plurality of apparatuses 1 are arranged in series. The vacuum chamber is held by means of mechanical pumps at a residual gas pressure of $10^{-4}$ to 10 mbar, preferably $10^{-2}$ mbar, and the substrate deposition of the present embodiment is made in this residual gas atmosphere. Optionally, flushing can be performed by means of inert gases such as nitrogen, helium, argon and the like. Substrates 60 are moved in a continuous passage via entrance and exit locks into the vacuum chamber and moved over apparatuses 1. Rollers are provided between apparatuses 1 as carrier devices on which substrates 60 move on their passage over the apparatuses. The planar substrates 60 are directed with the deposition side downward. In FIG. 1, substrates 60 are guided perpendicular to paper plane.

Apparatus 1 comprises a heated shield 10 rectangular in cross section made of graphite (for instance fiber-reinforced graphite) or other high-melting materials, such as tantalum or molybdenum, which are inert against the material to be evaporized. Within the heat shield, a rectangular receptacle 20 is provided. In the present embodiment, it is made of graphite.

Receptacle 20 having a large volume as compared to graphite crucibles formerly used includes a large-area top opening 22 and has a height which is sufficient to hold a material supply 70 (in the present case CdTe granulate) for a highest possible production period. In the present embodiment, rectangular opening 22 has dimensions of 250 mm by 700 mm and the receptacle can hold, at a depth of 200 mm, about 80 kg CdTe. With one receptacle filling, production periods of several days can be obtained. If a plurality of receptacles are successively arranged in the moving direction of the substrate, the production period can be extended without any difficulties up to one week.

Figure 2:
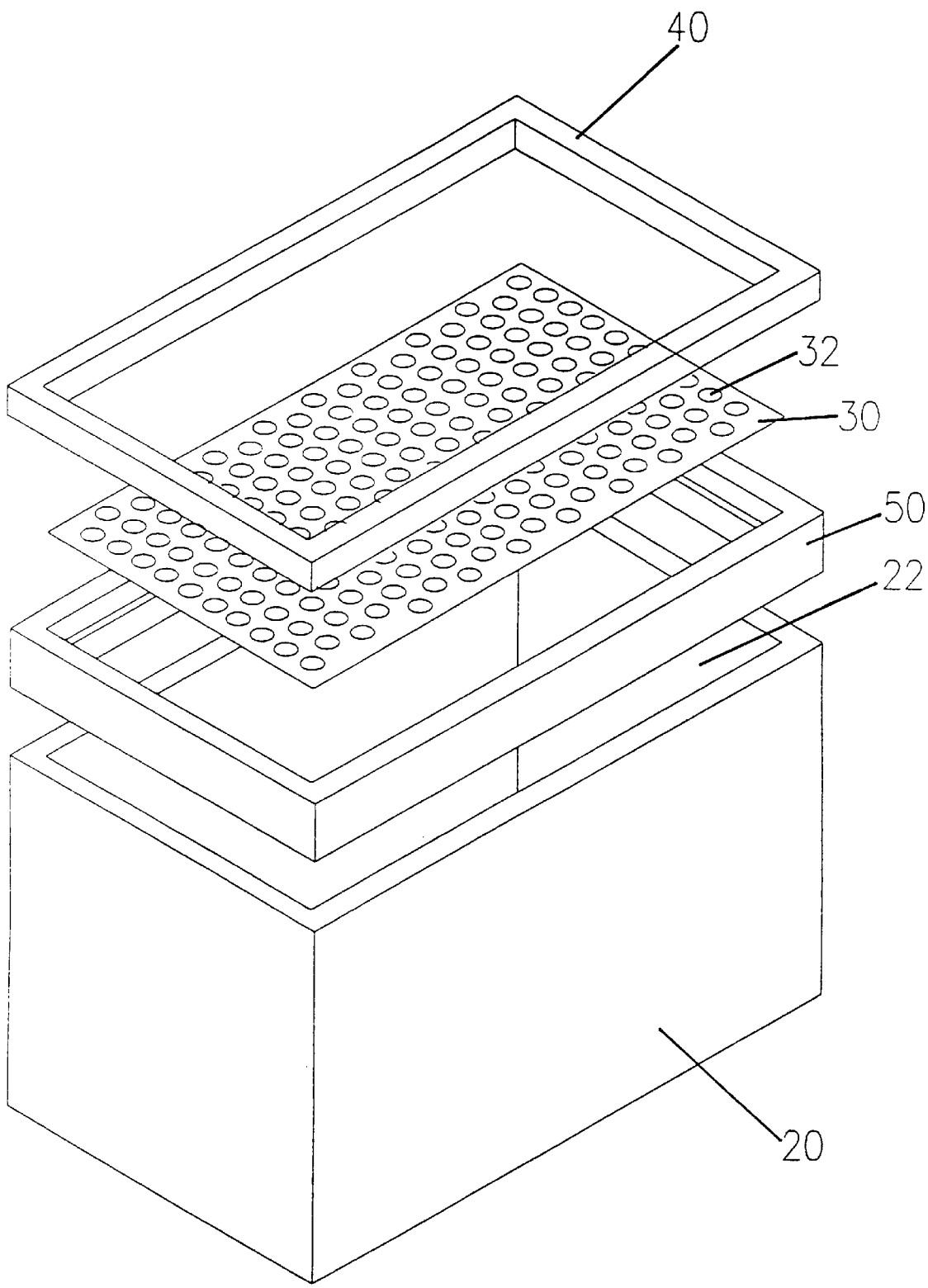
FIG. 2 is a perspective exploded view of a material receptacle, a cover and a heated frame of FIG. 1.

According to FIG. 2, a perforated hole plate 30 made of graphite (SIGRA-BOND (registered trade mark) by SGL Carbon Group) is embedded into the upper receptacle edge. Plate 30 may however also include other materials as mentioned above which are inert against the deposition material. Plate 30 is not placed directly on the receptacle edge but rather in an insulating ceramic holder 50. In the present embodiment, the latter is L-shaped in cross section and is fastened in the receptacle edge by means of pins, not shown. In the shown example, plate 30 rests in the ceramic holder 50 consisting for instance of alumina. In the present embodiment, through-holes 32 of plate 30 have a medium diameter of about two mm. On one hand, through-holes 32 are so large that they do not significantly prevent the passage of the sublimation-evaporated material through plate 30, and on the other hand, are small enough not to impair the desired uncoupling from the material supply. This is made possible in that, as shown, a plurality of holes having a diameter of about one to four mm are uniformly arranged at a small distance relative to each other, as can particularly be taken from FIG. 3. In the present embodiment, holes 32 are arranged in a cubic face centered hole pattern having dimensions of 8 by 8 mm. Therefrom results an open surface area portion of 10% of the total surface of plate 30 passing the sublimated material. At the marginal zones of the substrate, the holes are provided larger and/or tighter in order to obtain a uniform deposition over the total plate width. (A substrate point is not only impacted by material passing through the hole disposed directly under it but also by the surrounding holes, and that is why in case of an unchanged hole structure deposition in marginal zones would be smaller.)

A plate as compared to wire-mesh shaped embodiments of electrically and thermally conductive material which in principle are possible is well, has the advantage that the percentage of the open passage area may be adjusted by one single plate to suitable values of between 5 and 25%. The passage through the hole pattern may, moreover, be locally changed. In the case of a wire mesh, the passage percentage, as a rule, is too large for the desired uncoupling so that two or more meshes arranged one above the other would have to be employed.

Graphite as the material for the plate offers the advantage of good electric conductivity and also thermal conductivity, and as corrosion proof material has the advantage of not reacting with the vapor particles. Graphite plate 30 can also be heated directly. To this end, the plate is directly connected to a separate ohmic heater.

Distance A (exaggeratedly represented in the Figure) between substrate 60 and hole plate 30 is adjusted by guiding and distance means, not shown, to 2 to 50 mm. In the present embodiment, the distance amounts to about 10 mm. It corresponds to the CSS distance normally to be adjusted between the substrate and the source material.

A heatable frame 40 also made of graphite is disposed at an elevated position relative to plate 30. In this case the material alternatives described above in connection with plate 30 and shield 10 as well as with receptacle 20 are in principle possible too. Frame 40 is secured as shown to the upper side of ceramic holder 50 and can be heated, again by direct ohmic heating, independently from plate 30 and receptacle 20. Rigid electric feed wires may be used for stabilizing the light frame 40. In the present embodiment, ceramic holder 50 is so designed that it provides, as a one-piece part, both for electric insulation of receptacle 20 relative to plate 30 and of plate 30 relative to frame 40, so that separate heating circuits are possible for frame 40 and plate 30. Numerous further insulation measures can, however, be selected by those versed in the art. In the actual apparatus, the substrate is guided at smallest possible distance over frame 40 (e.g. 1 or 2 mm).

Receptacle 20 is also independently heated, in the present embodiment by means of heating lamps 12 in the form of halogen lamps or special infrared lamps with carbon filaments, so called "Carbonstrahler" (carbon radiators). For the deposition process, heating is generally effected so that hole plate 30 is hotter for a few degrees Celsius, preferably about 2 to 5° C., than receptacle 20 which in the present embodiment is heated to about 750° C. as compared to substrate 60 which is preheated to a temperature of about 500° C. When moved over apparatus 1, the substrate retains its preheating temperature of about 500° C. because it is heated up by hot apparatus elements 12, 20 and 30. Frame 40 on the other hand, is again heated to a higher temperature than hole plate 30, in the present case about preferably 2 to 5° C. higher. With the particular deposition parameters, the temperature ranges here specified have proved to be suitable. The temperature ranges for substrate (480° C. to 520° C.) and the receptacle or the CdTe source (700° C. to 770° C.), respectively, correspond to the data specified in EP 92,116, 254.1 corresponding to EP 0,535,522 A2 and U.S. Pat. No. 5,304,499. The present inventors found out that the deposition parameters specified in that patent specification for the conventional small CSS apparatus (including pressures, deposition thickness, etc) can also be successfully applied in the large scale apparatus of the present invention. As to these parameters which are also considered preferred in the present invention, reference is explicitly made to that prior art patent.

It is not impossible that the above mentioned temperature differences may be smaller or higher. In general, however, a temperature difference of less than 2° C. between hole plate 30 and receptacle 20 as well as plate 30 and frame 40 will not be sufficient for the effects described in the following. Larger temperature differences above 10° C. are possible in principle, the respective deposition parameters should, however, not be changed by the temperature gradients which means that the temperature difference between hole plate 30 acting as physical deposition source and substrate 60 should fulfil the respective deposition parameters and that in the material supply, moreover, an optimum sublimation temperature can be adjusted.

As already described, the temperature difference between hole plate 30 and receptacle 20 ensures that the deposition parameters do not depend on the filling level of receptacle 20. Furthermore, changes of the deposition rate distribution due to shadowing effects caused by the decreasing filling level need not be compensated. Uninterrupted production period of one week is possible by utilizing the apparatus described and adjusting a deposition rate of about 10 $\mu$m/minute and performing continuous deposition of about 0.7 m² large substrates. The local distribution of the deposition rate can be adjusted by the design of the hole pattern in hole plate 30 so that the deposition rate distribution can be selected by changing the plate. In other words, the deposition rate distribution is uncoupled from the source consisting of heated receptacle and material supply or material source.

The heating frame 40 offers the advantage that due to its increased temperature the material loss at the edge of receptacle 20 which is open on top may be reduced up to 80%. Undesired condensation effects in those otherwise colder edge zone are furthermore avoided that might also impede the quality of the deposition at the marginal zones of the substrate.

Figure 3:
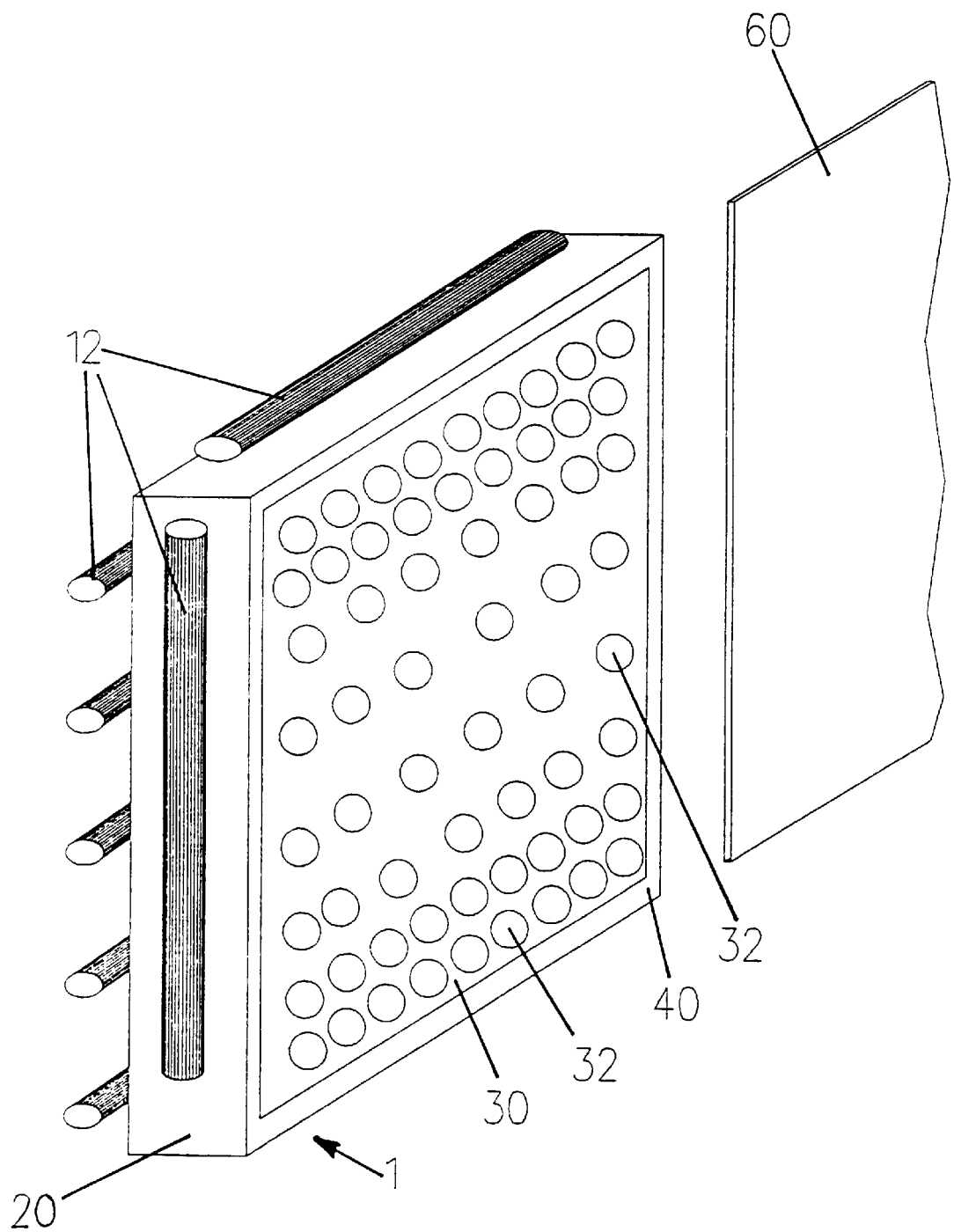
FIG. 3 is a view on a material receptacle having a cover and a heated frame for vertical deposition according to a further embodiment of the present invention.

A further advantage offered by the apparatus of the present invention can be taken from FIG. 3 wherein hole plate 30 is perpendicularly disposed in front of opening 22 of receptacle 20 which has an open side. Thereby, a deposition process in continuously working vertical plants becomes possible. Within receptacle 20 moreover, fan-like divisions have been made and additional hole plates have been provided in order to obtain a uniform distribution of the deposition material. In view of the uncoupling effect according to the invention it is very well possible to provide in a perpendicularly disposed apparatus according to FIG. 3 a container for the material supply, the opening of which covered by hole plate 30 joins a container side wall in the area of which a larger material supply is provided on the bottom of the container. It is also possible to stack a plurality of such containers one upon the other to obtain a single large-surface deposition source.

In the present embodiment, a plate was inserted to cover the opening of receptacle 20. Such plane structure is necessary for common deposition operations. If for instance different deposition parameters are to be adjusted over the substrate, it is, however, also conceivable to employ a curved structure provided with throughholes as cover. Neither need the substrate be always plane. In case of non-planar substrates, the different distance between hole plate and deposition surface can, moreover, be adjusted by varying the hole pattern of the hole plate or cover.

In the case of evaporation material tending to particle emission, it is possible to use e.g. two slightly spaced hole plates having hole patterns offset relative to each other instead of a single plate. In this way, it is avoided that particles chipping off from the evaporation material find their way as sputters through a hole in the plate and reach the substrate. By means of the two plates and by offsetting the hole pattern, optical shielding is ensured.

What is claimed is:

1. An apparatus for depositing CdS and CdTe layers on a substrate by means of a CSS process, said apparatus comprising:
   a heated receptacle having an opening, said receptacle being heated to a first temperature;
   an initially fixed volume of material supply disposed in said receptacle, and selected from a group consisting of CdS and CdTe, wherein said heated receptacle sublimates said material supply to form a sublimated material which exits said receptacle through said opening to decrease said initially fixed volume of material supply;
   a heated plate covering said opening, and including a plurality of through-holes through which said sublimated material passes, said plate being heated to a second temperature which is higher than said first temperature to form a sublimation source;
   a substrate disposed outside of said receptacle and having a face facing said plate for receiving said sublimated material, said face being spaced a distance between about 2 and about 50 mm from said plate.

2. Apparatus according to claim 1, characterized in that said through-holes are perforations.

3. Apparatus according to claim 2, characterized in that said through-holes define a pattern in said plate (30), wherein said plate is more porous proximal edges of said plate than in a central portion of said plate.

4. Apparatus according to claim 1, characterized in that said plate (30) consists of electrically conductive material.

5. Apparatus according to claim 4, characterized in that said electrically conductive material is graphite.

6. Apparatus according to claim 1, characterized in that a frame (40) extends past said plate toward said substrate and adjacent at least one edge of said plate, and that second means are provided for independently heating said frame (40) such that it is kept at a temperature higher than that of said plate.

7. Apparatus according to claim 6, characterized in that said plate (30) and said frame (40) each are electrically insulated relative to each other and said plate (30) and said frame (40) each are connected to an ohmic heating means.

8. Apparatus according to claim 1, characterized in that for perpendicular substrate deposition, said plate (30) is disposed in a side opening of said receptacle (20).

9. Apparatus according to claim 8, characterized in that in said receptacle (20) includes divisions subdividing the interior of the receptacle.

10. Apparatus according to claim 1, characterized in that said receptacle is a graphite receptacle (20).

11. Apparatus according to claim 1, characterized in that said receptacle (20) consists of a high-melting point material.

12. Apparatus according to claim 1, characterized in that said material supply is granular.

13. Apparatus according to claim 1, characterized in that said plate (30) is flat.

14. Apparatus according to claim 1, characterized in that said plate (30) is curved.

15. Apparatus according to claim 6, characterized in that said frame (40) is a separate part attached to the upper edge of the receptacle at an elevated position relative to said plate (30).

16. Apparatus according to claim 6, characterized in that said frame (40) is formed as an integral part of said receptacle.

* * * * *